(12) United States Patent
Ogasawara

(10) Patent No.: US 7,924,109 B2
(45) Date of Patent: Apr. 12, 2011

(54) MEMS OSCILLATOR

(75) Inventor: Kensuke Ogasawara, Chiba (JP)

(73) Assignee: Seiko Instruments Inc., Chiba (JP)

( * ) Notice: Subject to any disclaimer, the term of this patent is extended or adjusted under 35 U.S.C. 154(b) by 140 days.

(21) Appl. No.: 12/389,717

(22) Filed: Feb. 20, 2009

(65) Prior Publication Data

US 2009/0212877 A1   Aug. 27, 2009

(30) Foreign Application Priority Data

Feb. 22, 2008   (JP) ................................. 2008-041144

(51) Int. Cl.
*H03L 1/02*   (2006.01)
*G04C 3/10*   (2006.01)

(52) U.S. Cl. ..................... 331/176; 331/116 M; 331/156

(58) Field of Classification Search .................. 331/154, 331/156, 176, 116 M
See application file for complete search history.

(56) References Cited

U.S. PATENT DOCUMENTS

| | | | |
|---|---|---|---|
| 6,292,066 B1 * | 9/2001 | Shibuya et al. | 331/176 |
| 6,995,622 B2 * | 2/2006 | Partridge et al. | 331/66 |
| 2007/0222532 A1 * | 9/2007 | Takeuchi et al. | 331/176 |

FOREIGN PATENT DOCUMENTS

JP   2007-518351 A   7/2007

* cited by examiner

*Primary Examiner* — Robert Pascal
*Assistant Examiner* — James E Goodley
(74) *Attorney, Agent, or Firm* — Brinks Hofer Gilson & Lione

(57) ABSTRACT

Provided is a MEMS oscillation circuit which performs temperature compensation of a MEMS resonator with a simple circuit, which is mild so that an output clock does not have jitter, and which makes the range of fluctuations of a reference frequency from a reference value equivalent to a range of digital processing. The MEMS oscillator includes a MEMS resonator, a temperature measurement unit for measuring a temperature and outputting a detected voltage corresponding to the temperature, and a bias voltage control circuit for applying the MEMS resonator with a bias voltage which changes the resonant frequency of the MEMS resonator in a manner opposite to a change of the resonant frequency of the MEMS resonator due to temperature change correspondingly to the detected voltage.

10 Claims, 4 Drawing Sheets

| TEMPERATURE(°C) | VBIAS(V) | Freq(MHz) | AMOUNT OF CHANGE | RATE OF CHANGE/V (ppm) |
|---|---|---|---|---|
| 20 | 10 | 1.6538 | 0.0 |  |
| 20 | 20 | 1.6531 | -423.3 | 42.33 |
| 20 | 30 | 1.6520 | -1088.4 | 54.42 |
| 20 | 40 | 1.6504 | -2025.7 | 67.52 |

MEMS OSCILLATOR

RELATED APPLICATIONS

This application claims priority under 35 U.S.C. §119 to Japanese Patent Application No. JP2008-041144 filed on Feb. 22, 2008, the entire content of which is hereby incorporated by reference.

BACKGROUND OF THE INVENTION

1. Field of the Invention

The present invention relates to a micro electromechanical systems (MEMS) oscillator in which a MEMS resonator made of a semiconductor material is used as a resonator.

2. Description of the Related Art

An oscillator is extensively used for generating a reference frequency used in a clock, a personal computer, or the like. A quartz resonator is generally used as a resonator in an oscillator which requires a highly accurate frequency, because of a high Q value of the oscillation frequency and temperature stability.

In recent years, depending on the application, a MEMS resonator made of a semiconductor material such as a silicon has been used instead of the quartz resonator because the MEMS resonator can be easily miniaturized and can be formed at low cost.

However, because the resonant frequency of the MEMS resonator made of a semiconductor material depends on the temperature more compared with the quartz resonator, in order to materialize a temperature-stable resonant frequency with a MEMS resonator, temperature compensation of the resonant frequency is definitely required.

For example, it is known that the resonant frequency of a MEMS resonator made of a p-type silicon decreases as the temperature rises.

By forming a dielectric film for temperature compensation, for example, a silicon oxide film, on a surface of the above-mentioned MEMS resonator, the temperature dependence of the resonant frequency is reduced, and a temperature-stable frequency can be oscillated (see, for example, JP 2007-518351 A).

More specifically, by forming on the MEMS resonator made of a silicon material a dielectric film which has the temperature characteristics of the resonant frequency, which is opposite to those of the silicon material, the temperature characteristics of the resonant frequency are improved.

However, even in a case where the above-mentioned dielectric film for temperature compensation is used, when the temperature is in the range of −40° C. to +80° C., the resonant frequency fluctuates from a reference value of the resonant frequency by about 200 ppm.

When the temperature is in the range of −40° C. to +80° C., fluctuations of the resonant frequency of an oscillator for generating a clock signal having a reference frequency, which is used in a clock, a personal computer, or the like, is required to be within a range of about 20 ppm from a reference value of the resonant frequency.

Therefore, as illustrated in FIG. 6, there is used a configuration in which fluctuations of the frequency due to temperature change is compensated for by digital signal processing of a frequency control voltage.

More specifically, as a basic configuration, a phase detector 101 determines a phase difference between a reference clock generated by a MEMS resonator 100 and an output clock output by the oscillator, a control voltage generating circuit 102 generates a control voltage for controlling the output clock from the phase difference, and a voltage control oscillator 103 uses the configuration for generating the control voltage to compensate for fluctuations of the frequency due to a temperature change by digital signal processing of the frequency control voltage.

Here, when the output clock generated by the voltage control oscillator 103 is fed back to the phase detector 101, a phase control circuit 104 controls the phase so that the frequency of the MEMS resonator 100, which is changed due to the temperature change, is corrected and outputs the corrected phase to the phase detector 101.

A storage unit 105 stores numeric values for phase control, which correspond to the temperatures, and a numeric value corresponding to the ambient temperature input from a temperature sensor 106 is output to the phase control circuit 104.

With the above-mentioned configuration, there can be formed a MEMS oscillator which is capable of making fluctuations of the resonant frequency within a range of about 20 ppm from a reference value when the temperature is in the range of −40° C. to +80° C.

When the above-mentioned digital processing is carried out, although temperature compensation of the oscillation frequency can be made with high accuracy. However, the phase control circuit carries out floating-point operations and the like, and it is necessary to provide the storage unit 105, causing problems that the circuit scale for the digital processing becomes large, the manufacturing cost is increased, and the oscillation circuit cannot be miniaturized.

Further, the above-mentioned related art has a weak point that, because a phase locked loop (PLL) is used, fluctuations with jitter is caused within a controlled range, and noise is generated.

SUMMARY OF THE INVENTION

The present invention has been made in view of the above-mentioned circumstances, and an object of the present invention is to provide a MEMS oscillation circuit which performs temperature compensation of a MEMS resonator with a simple circuit, which is mild so that an output clock does not have jitter, and which makes a range of fluctuations of a reference frequency with respect to a reference value equivalent to a range of the above-mentioned digital processing.

According to the present invention, a MEMS oscillator includes a MEMS resonator, a temperature measurement unit for measuring a temperature and outputting a detected voltage corresponding to the temperature, and a bias voltage control circuit for applying the MEMS resonator with a bias voltage which changes the resonant frequency of the MEMS resonator in a manner opposite to a change of the resonant frequency of the MEMS resonator due to temperature change correspondingly to the detected voltage.

In the MEMS oscillator according to the present invention, the bias voltage control circuit includes an amplifier circuit in which an amplification factor of the bias voltage is set so that a slope of the change of the resonant frequency by the bias voltage has a polarity opposite to a polarity of and the same absolute value as the slope of the change of the resonant frequency due to temperature change.

In the MEMS oscillator according to the present invention, the amplifier circuit adjusts a reference frequency which is referred to in controlling an oscillation frequency by controlling a voltage value of a reference voltage to be compared with the control voltage.

In the MEMS oscillator according to the present invention, the amplifier circuit includes an adjustment unit for the amplification factor.

As described above, according to the present invention, the bias voltage corresponding to the temperature change is applied to the MEMS resonator so that the resonant frequency is changed with the absolute value of the slope of the change being the same as the absolute value of the slope of the change of the resonant frequency due to temperature change and the polarity of the slope of the change being the opposite to the polarity of the slope of the change of the resonant frequency due to temperature change, and hence the change of the resonant frequency of the MEMS resonator due to temperature change can be canceled by the change of the resonant frequency by the bias voltage. Accordingly, there can be realized a configuration in which, within the temperature specifications, the range of fluctuations of the resonant frequency of the MEMS resonator can be made to be equivalent to the range of the digital processing by a simple configuration using an amplifier circuit, and, compared with the conventional case, the circuit can be miniaturized and the manufacturing cost can be reduced.

Further, according to the present invention, the bias voltage corresponding to the temperature change is generated by an analog circuit, and hence jitter is not caused every time temperature compensation is performed as in digital control, a clock does not include a noise component due to jitter, and the signal purity of a generated reference clock can be improved compared with the conventional digital control.

DETAILED DESCRIPTION OF THE INVENTION

Figure 1:
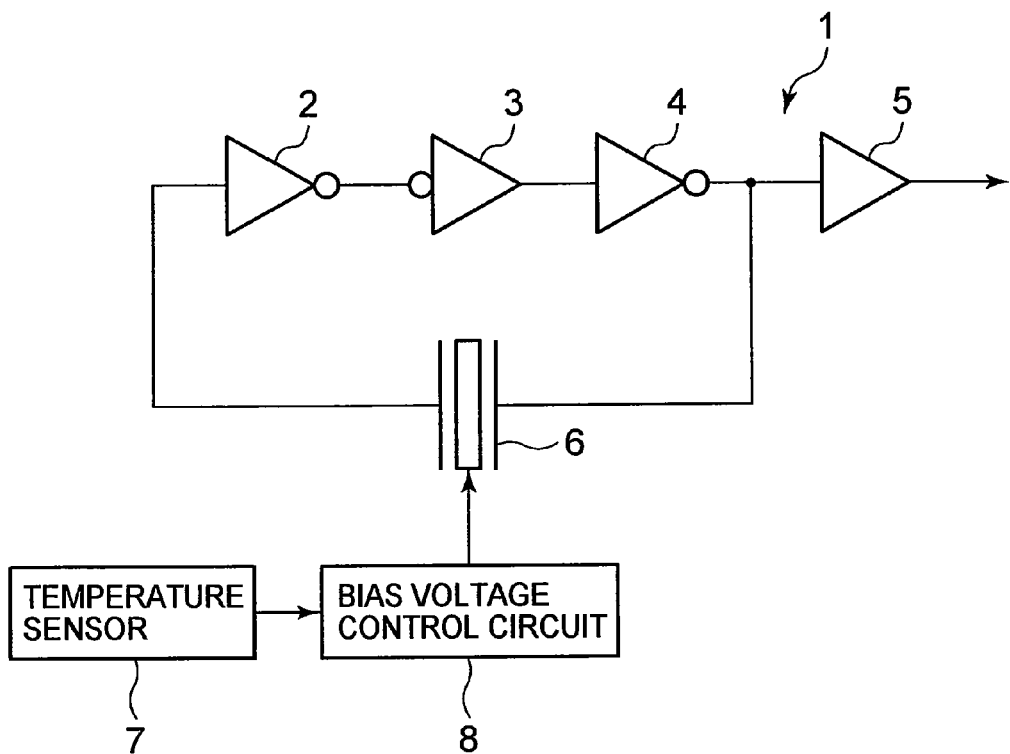
FIG. 1 is a block diagram illustrating a configuration example of a MEMS oscillator according to an embodiment of the present invention.

A MEMS oscillator according to an embodiment of the present invention is described in the following with reference to the attached drawings. FIG. 1 is a block diagram illustrating a configuration of the MEMS oscillator according to this embodiment.

In FIG. 1, an oscillator 1 includes inverters 2, 3, and 4, a buffer 5, a MEMS resonator 6, a temperature sensor 7, and a bias voltage control circuit 8.

The inverters 2, 3, and 4 amplify an output voltage which is input from a terminal on a sensing side of the MEMS resonator 6, make a voltage of a polarity opposite to a polarity of the output voltage to be output to a terminal on a driving side of the MEMS resonator 6, drive the MEMS resonator 6 as a resonator, and keeps an excited state of the MEMS resonator 6 by the resonant frequency constant.

The buffer 5 outputs to the outside a clock generated by the MEMS resonator 6 being in the excited state.

The temperature sensor 7 outputs to the bias voltage control circuit 8 a detected voltage Vf which has a voltage value corresponding to the ambient temperature, that is, in proportion to the temperature.

The bias voltage control circuit 8 generates a bias voltage VBIAS from the detected voltage Vf which is input from the temperature sensor 7 and applies the bias voltage VBIAS to the MEMS resonator 6. The resonant frequency is changed by the bias voltage VBIAS which varies correspondingly to the temperature change with the absolute value of the slope of the change being the same as the absolute value of the slope of the change of the resonant frequency due to temperature change and the polarity of the slope of the change being the opposite to that of the slope of the change of the resonant frequency due to temperature change.

Figure 2:
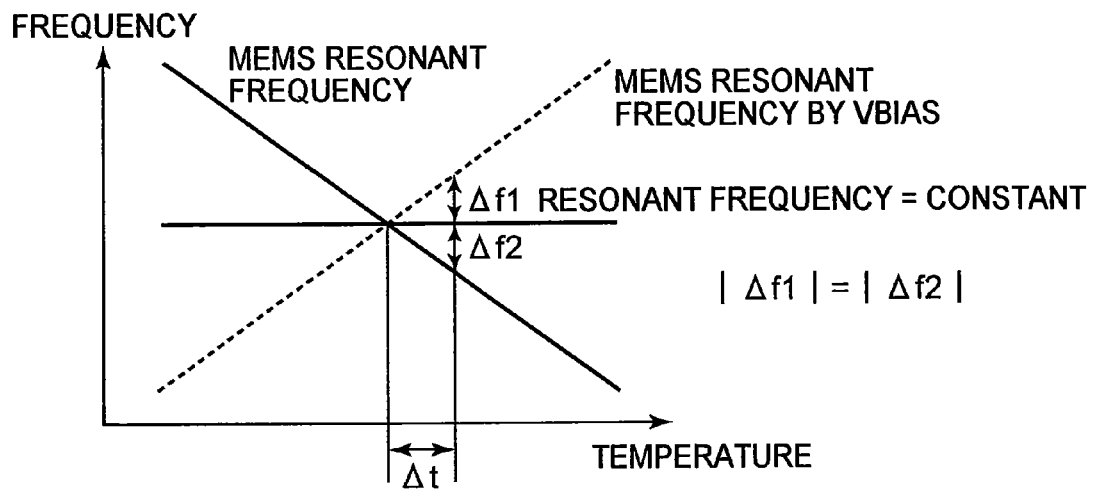
FIG. 2 is a graph illustrating a relationship between a temperature and a resonant frequency of a MEMS resonator for describing temperature compensation of the resonant frequency by changing a bias voltage VBIAS of a bias voltage control circuit illustrated in FIG. 1.

More specifically, as illustrated in FIG. 2, the resonant frequency of the MEMS resonator 6, in the case of, for example, a p-type silicon having a p-type impurity diffused therein (the same can be said with regard to an n-type silicon having an n-type impurity diffused therein), decreases as the temperature rises.

Meanwhile, it is known that the resonant frequency of a MEMS resonator, when the MEMS resonator is made of a p-type silicon, increases as the voltage value of the applied bias voltage decreases.

Therefore, by decreasing the bias voltage VBIAS with respect to the temperature rise correspondingly to the detected voltage which is output by the temperature sensor 7, the resonant frequency of the MEMS resonator 6 which is decreased due to temperature rise can be raised to the reference frequency, and fluctuations of the resonant frequency due to temperature change can be limited within a controlled range with a reference frequency set in advance being as a center thereof. More specifically, in this embodiment, the bias voltage can be changed correspondingly to the temperature change, and the change of the resonant frequency of the MEMS resonator due to temperature change can be canceled out.

Here, the bias voltage control circuit 8 outputs the bias voltage VBIAS so that, with regard to a temperature change of $\Delta t°$ C., the absolute value of a change amount $\Delta f1$ ($\Delta t$) of the resonant frequency of the MEMS resonator 6 is equal to the absolute value of a change amount $\Delta f2$ ($\Delta$VBIAS ($\Delta v$)) of the resonant frequency by an amount of change $\Delta$VBIAS ($\Delta v$) of the bias voltage obtained by a difference $\Delta v$ of the detected voltage, and so that the polarity of the change amount $\Delta f1$ and the polarity of the change amount $\Delta f2$ are opposite to each other. More specifically, as illustrated in FIG. 2, when the resonant frequency is incremented by $\Delta f1$ due to temperature change, the resonant frequency is made to be decremented by $\Delta f2$ which is equal to $\Delta f1$. Conversely, when the resonant frequency is decremented by $\Delta f1$, the resonant frequency is made to be incremented by $\Delta f2$ which is equal to $\Delta f1$. In this way, a change of the resonant frequency due to temperature change is canceled.

Figure 3:
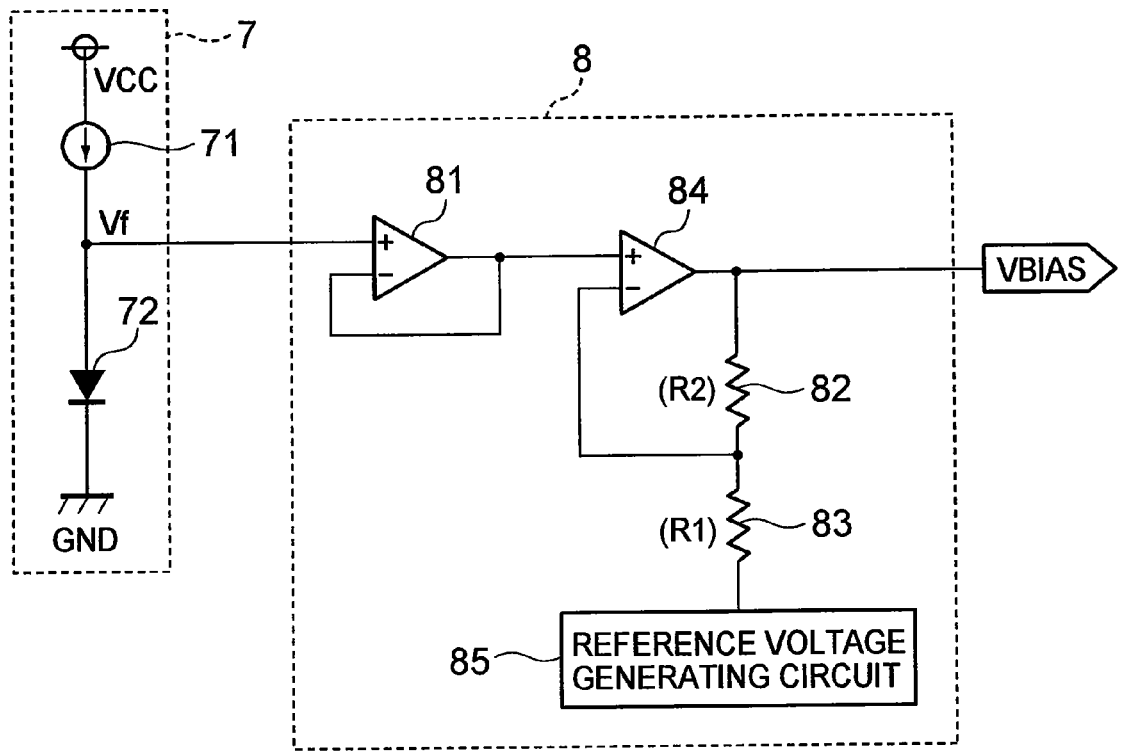
FIG. 3 is a conceptual diagram illustrating a configuration example of the bias voltage control circuit illustrated in FIG. 1.

Next, configurations of the temperature sensor 7 and the bias voltage control circuit 8 illustrated in FIG. 1 are described with reference to FIG. 3. FIG. 3 is a conceptual diagram illustrating a circuit of the temperature sensor 7 and the bias voltage control circuit 8.

The temperature sensor 7 includes a constant current circuit 71 and a diode 72. When the temperature rises, a current which passes through the diode 72 increases and the detected voltage Vf drops. Conversely, when the temperature drops, the current which passes through the diode 72 decreases and the detected voltage Vf rises.

The bias voltage control circuit 8 includes a buffer circuit 81, resistors 82 and 83, an amplifier circuit 84, and a reference voltage generating circuit 85.

The buffer circuit 81 is a voltage follower circuit formed of an amplifier (operational amplifier), and outputs the detected voltage Vf which is input from the temperature sensor 7 to a positive side terminal of the amplifier circuit 84 via the resistor 83.

A reference voltage Vref which is input from the reference voltage generating circuit 85 is input to a negative side terminal of the amplifier circuit 84 (operational amplifier).

Here, in order to generate the bias voltage VBIAS so that the slope of the change of the resonant frequency of the MEMS resonator 6 by the bias voltage VBIAS is opposite to the slope of the change of the resonant frequency of the MEMS resonator 6 due to temperature change, the amplifier circuit 84 and the resistors 82 and 83 carry out noninverting amplification according to the slope of the change of the detected voltage Vf from the temperature sensor 7 due to temperature change.

More specifically, in order to cancel a decrease in resonant frequency due to temperature rise, the bias voltage VBIAS is made to drop according to the temperature change, i.e., temperature rise, and noninverting amplification is carried out so that the resonant frequency is increased. Therefore, it is necessary to accommodate a negative slope, i.e., the detected voltage Vf drops when the temperature sensed by the temperature sensor 7 rises and to make (polarity of) the slope of the change of the bias voltage VBIAS due to temperature change the same as the slope of the detected voltage Vf, and hence noninverting amplification has to be carried out. If the characteristics of the temperature sensor 7 are such that the detected voltage Vf increases as the temperature rises, noninverting amplification is not carried out and inverting amplification is carried out.

The amplifier circuit 84 outputs from an output terminal, as the bias voltage VBIAS, a voltage determined by adding, to the reference voltage Vref, a difference between the voltage output from the buffer circuit 81, that is, the detected voltage Vf, and the reference voltage Vref output from the reference voltage generating circuit 85, which is multiplied by an amplification factor (gain) obtained by (a resistance value R2 of the resistor 82)/(a resistance value R1 of the resistor 83):

$$VBIAS = Vref + (Vf - Vref) \times (R2/R1).$$

Figure 4:
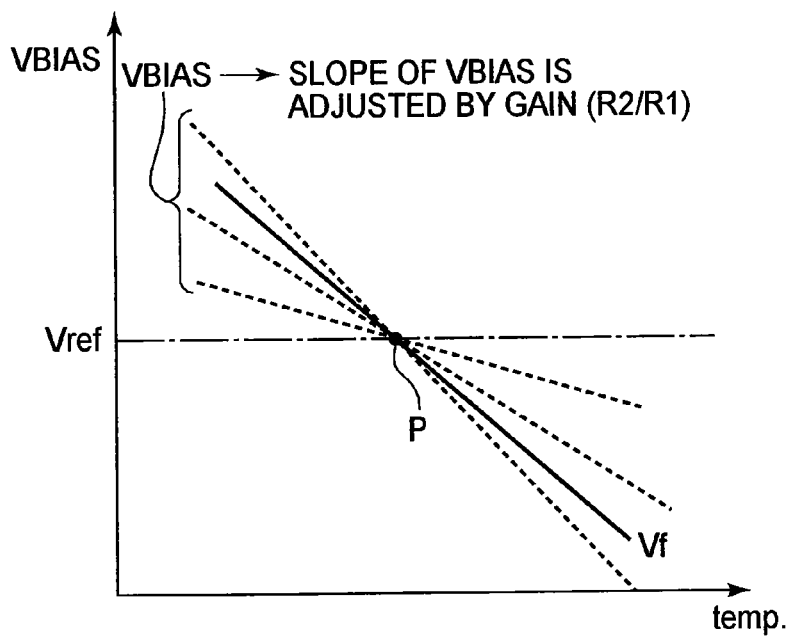
FIG. 4 is a graph illustrating a relationship between the temperature and the bias voltage VBIAS output from the bias voltage control circuit illustrated in FIG. 3.

The reference voltage Vref is, as illustrated in FIG. 4, the bias voltage which generates a target resonant frequency set in advance in the amplifier circuit 84, that is, the voltage which generates a target oscillation frequency output from the MEMS oscillator.

Therefore, the amplifier circuit 84 outputs the bias voltage VBIAS. The center of the bias voltage VBIAS is the reference voltage Vref (voltage at a point P which is an intersection of lines plotted by VBIAS with various amplification factors), and the bias voltage VBIAS is increased or decreased by (the amount of the detected voltage Vf)×(the amplification factor). More specifically, when Vf>Vref, a voltage determined by adding, to the reference voltage Vref, "the detected voltage Vf minus the reference voltage Vref" multiplied by the amplification factor is output as the bias voltage VBIAS. When Vref=Vf, the reference voltage Vref is output as the bias voltage VBIAS. When Vf<Vref, a voltage determined by adding, to the reference voltage Vref, "the detected voltage Vf minus the reference voltage Vref" multiplied by the amplification factor, that is, a voltage determined by subtracting "the reference voltage Vref minus the detected voltage Vf" multiplied by the amplification factor from the reference voltage Vref, is output as the bias voltage VBIAS.

By forming the resistor 82 or the resistor 83 as a variable resistor or the like and adjusting the resistance value of either one or both of the resistors 82 and 83 by the variable resistor to change the amplification factor (R2/R1), the rate of change of the bias voltage VBIAS corresponding to the temperature, that is, the slope of the change of the bias voltage VBIAS corresponding to the temperature can be arbitrarily adjusted so as to correspond to the temperature characteristics of the MEMS resonator.

Further, means for adjusting the voltage value of the reference voltage Vref is added to the reference voltage generating circuit 85. By adjusting the reference voltage Vref from the outside, the reference resonant frequency can be changed arbitrarily, and the target resonant frequency can be set according to the resonant frequency of the MEMS resonator 6.

In the configuration described above, in this embodiment, the bias voltage control circuit 8 is configured so that the polarity (positive or negative) of the slope of the change of the resonant frequency by the bias voltage VBIAS is opposite to the polarity of the slope of the change of the resonant frequency due to temperature change with respect to the MEMS resonator 6.

In adjustment after the MEMS oscillator 1 is manufactured, the frequency of an output clock is measured at, for example, two different temperatures, and a deviation of the measured frequency from the target reference frequency is detected.

Then, by changing the resistance values of the resistors 82 and 83 and adjusting the amplification factor, the difference between the frequencies of the clocks output at the temperatures is controlled to be minimum.

After fluctuations between the temperatures of the frequency of the output clock are made to be within a reference value, when the adjusted frequency is deviated from the target reference frequency, adjustment is made so that the reference voltage Vref is changed to attain the target reference frequency.

Further, in the same product, the resonant frequencies of a plurality of MEMS resonators 6 at the respective temperatures are measured, and the measured resonant frequencies of the MEMS resonators 6 are averaged for each temperature, whereby an average value of the characteristics of the change of the resonant frequency due to temperature change of the MEMS resonators 6 in the same product is determined.

This embodiment is configured to mainly attain an object of making fine adjustment of the target reference frequency, and thus the reference voltage Vref corresponding to the reference frequency is set in advance according to the average value of the rates of change of the resonant frequency due to temperature change (slope of the change of the resonant frequency due to temperature change), and, as described above, the reference voltage Vref is controlled after the product is manufactured to adjust the reference frequency.

Together with this, in the temperature sensor 7, for example, the amount of a current flowing from a constant current source 71 is adjusted so that the detected voltage Vf is the reference voltage Vref at the temperature at which the reference voltage Vref is decided.

Further, the resistance values of the resistors 82 and 83 are set so that the slope of the change of the resonant frequency by the bias voltage VBIAS conforms to the slope of the change of the resonant frequency of the MEMS resonator 6 due to temperature change (the polarities of the two slopes are opposite to each other) in order to cancel the slope of the change of the resonant frequency of the MEMS resonator 6 due to temperature change by the slope of the change of the detected voltage Vf due to temperature change.

Further, in this embodiment, by providing the dielectric film for temperature compensation described in JP 2004-303283 A on the surface of the MEMS resonator, the accuracy of compensating for the resonant frequency with respect to the temperature can be further improved.

Figures 5A, 5B:
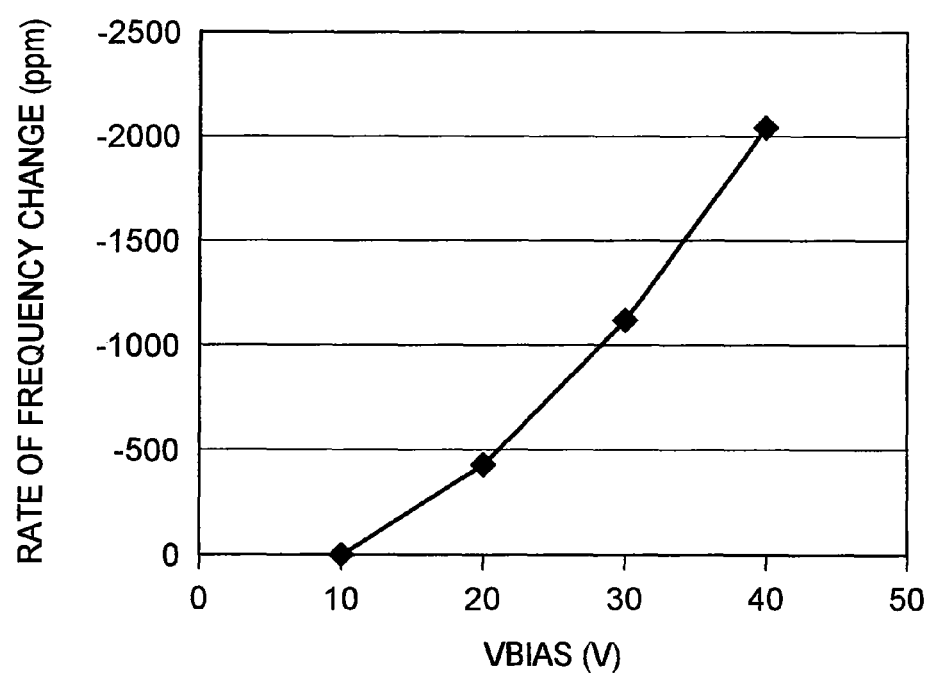
FIGS. 5A and 5B are a table and a graph, respectively, illustrating a change of the resonant frequency of an actual MEMS resonator by adjusting the bias voltage VBIAS.
Figure 6:
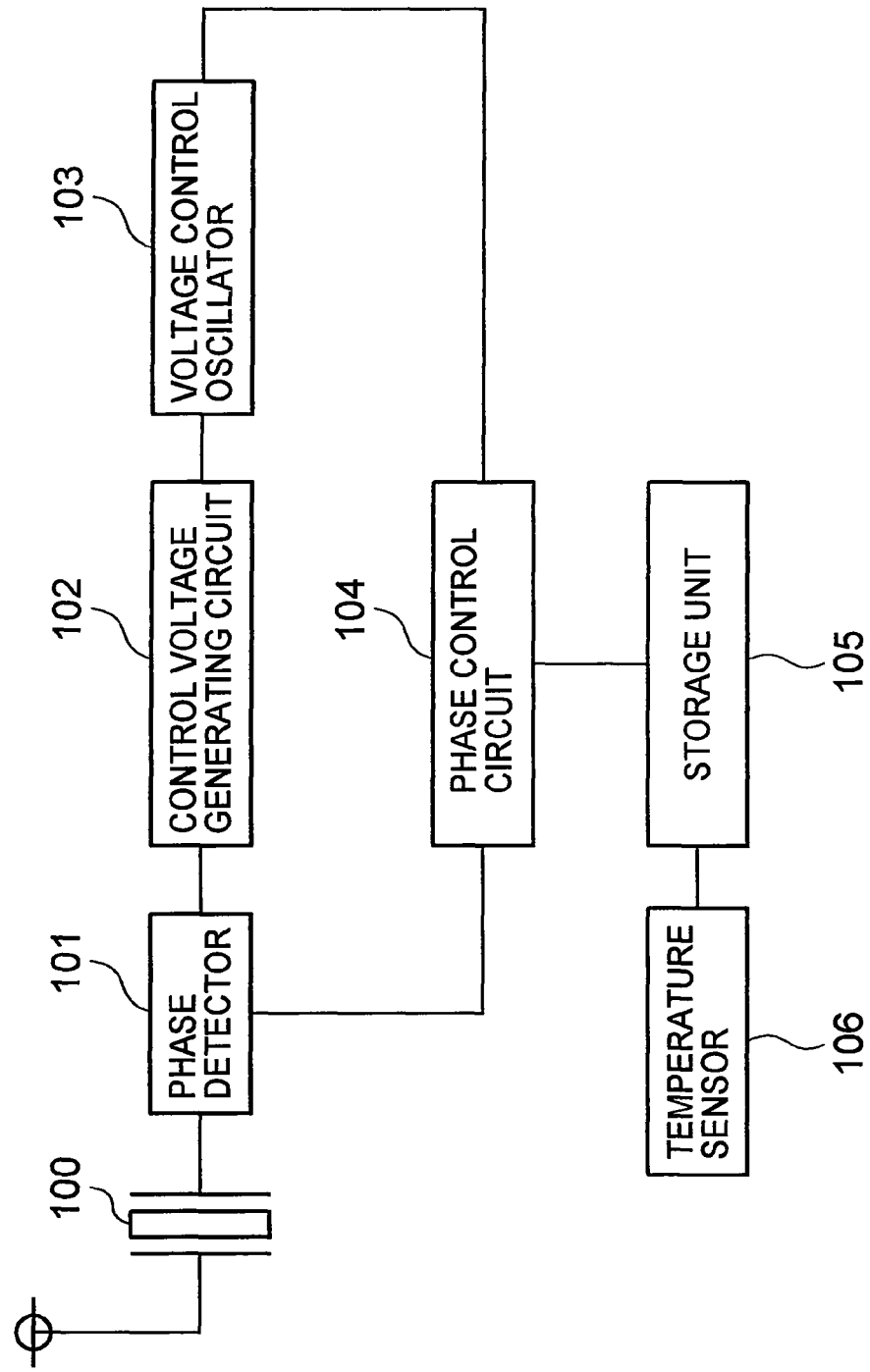
FIG. 6 is a block diagram illustrating a configuration example of a conventional digitally-controlled MEMS oscillator.

FIGS. 5A and 5B illustrate the change of the resonant frequency of the actual MEMS resonator 6 by adjusting the bias voltage VBIAS. FIG. 5A is a graph of the voltage, the frequency, the amount of change with respect to the reference frequency, and the rate of change of the frequency per voltage (ppm) with respect to the reference frequency when the temperature is kept at 20° C. and the bias voltage VBIAS is in increments of 10 V, with the reference being 1.6538 MHz when the temperature is 20° C. and the bias voltage VBIAS is 10 V. FIG. 5B is a graph of the bias voltage VBIAS versus the amount of change of the frequency of FIG. 5A.

As can be seen from FIGS. 5A and 5B, in this embodiment, a deviation of 20 ppm from the reference frequency can be adjusted by changing the bias voltage VBIAS.

The invention claimed is:

1. An MEMS oscillator comprising:
an MEMS resonator configured to oscillate at a resonant frequency which is a function of a bias voltage applied to the MEMS resonator;
a temperature sensor configured to output a signal indicative of a temperature of the MEMS resonator, wherein the signal from the temperature sensor has a voltage that changes proportionally to a change of the temperature; and
a bias voltage controller configured to apply the bias voltage determined based on the signal from the temperature sensor,
wherein the bias voltage controller comprises an amplifier configured to translate a deviation of the voltage of the signal from a reference voltage into the bias voltage to compensate the change of the resonant frequency caused by the change of the temperature,
wherein the amplifier comprises:
a first input terminal to which the signal from the temperature sensor is supplied;
an output terminal connected to a reference voltage circuit via serially connected first and second resistors; and
a second input terminal connected to a joint between the first and second resistors,
wherein the reference voltage is a voltage at the joint, and the bias voltage is proportional to a difference between the voltage of the signal and the reference voltage multiplied by a ratio between the resistances of first and second resistors.

2. The MEMS oscillator according to claim 1, wherein the temperature sensor comprises a constant current circuit and a diode serially connected to a ground, such that when the temperature rises, the constant current circuit flows more current through the diode, whereby the voltage of the signal drops, whereas when the temperature drops, the constant current circuit flows less current through the diode, whereby the voltage of the signal rises.

3. The MEMS oscillator according to claim 1, wherein the bias voltage is inversely proportional to the voltage of the signal.

4. The MEMS oscillator according to claim 1, wherein at least one of the first and second resistors is variable.

5. A method for compensating a change of a resonance frequency of an MEMS oscillator caused by a change of a temperature, comprising:
providing an MEMS resonator configured to oscillate at a resonant frequency which is a function of a bias voltage applied to the MEMS resonator;
measuring a temperature of the MEMS resonator and outputting a temperature signal indicative of the temperature of the MEMS resonator; and
applying the bias voltage determined based on the temperature signal to compensate the change of the resonant frequency caused by the change of the temperature,
wherein applying the bias voltage comprises:
translating a deviation of the voltage of the temperature signal supplied to a first amplifier input from a reference voltage supplied to a second amplifier input into the bias voltage supplied at an amplifier output, wherein the reference voltage is a voltage at a joint between first and second resistors connected serially between a reference voltage source and the amplifier output.

6. The method according to claim 5, wherein outputting a temperature signal comprises outputting a temperature signal at a voltage which changes proportionally to a change of the temperature.

7. The method according to claim 6, wherein outputting a temperature signal at a voltage comprises outputting a temperature signal at a voltage which drops when the temperature rises and rises when the temperature drops.

8. The method according to claim 6, wherein applying the bias voltage further comprises applying the bias voltage which is proportional to the voltage of the temperature signal.

9. The method according to claim 8, wherein the bias voltage is inversely proportional to the voltage of the temperature signal.

10. The method according to claim 5, wherein applying the bias voltage further comprises applying the bias voltage proportional to a difference between the voltage of the signal and the reference voltage.

* * * * *